United States Patent [19]

Campe et al.

[11] 4,079,238
[45] Mar. 14, 1978

[54] DUAL-CCD, REAL-TIME, FULLY-ANALOG CORRELATOR

[75] Inventors: Donald Ross Lampe, Ellicott City; Marvin Hart White, Laurel; Hung C. Lin, Silver Spring, all of Md.

[73] Assignee: Westinghouse Electric Corporation, Pittsburgh, Pa.

[21] Appl. No.: 625,696

[22] Filed: Oct. 24, 1975

[51] Int. Cl.² ............ G06G 7/19; H03K 5/159
[52] U.S. Cl. .................... 364/824; 307/221 D; 328/167; 357/24; 364/862
[58] Field of Search ............... 235/193, 181; 328/165, 328/167; 307/221 D, 221 C; 250/211 U; 357/24; 340/173 R

[56] References Cited

U.S. PATENT DOCUMENTS

| | | | |
|---|---|---|---|
| 3,781,574 | 12/1973 | White et al. | 307/221 D |
| 3,819,953 | 6/1974 | Puckette et al. | 307/221 D |
| 3,940,602 | 2/1976 | Lagnado et al. | 235/181 |
| 3,946,247 | 5/1976 | Collins et al. | 307/221 D |

*Primary Examiner*—Joseph F. Ruggiero
*Attorney, Agent, or Firm*—H. W. Patterson

[57] ABSTRACT

The proposed general-purpose, fully-analog device is capable of such functions as auto-correlation, cross-correlation, convolution, transversal filters, etc. at high speeds (one megahertz typical sample rates) with no analog-to-digital or digital-to-analog conversions. The device correlates analog samples in one CCD channel against analog samples in a second CCD channel by means of balanced MOSFET's which multiply the associated voltage samples to give current products that are summed for all multipliers. The two CCD channels include unique floating-clock sensor and buffer circuits which sense the CCD charge samples without affecting the efficiency of their propagation along the CCD shift register. The matched MOSFET multipliers and current summing amplifiers are also uniquely combined in a dual-differential configuration so as to minimize the nondestructive sensing and buffering cells and the matched multiplier cells with the longitudinal dimensions of the CCD, permitting the latter to be small for efficient propagation.

8 Claims, 38 Drawing Figures

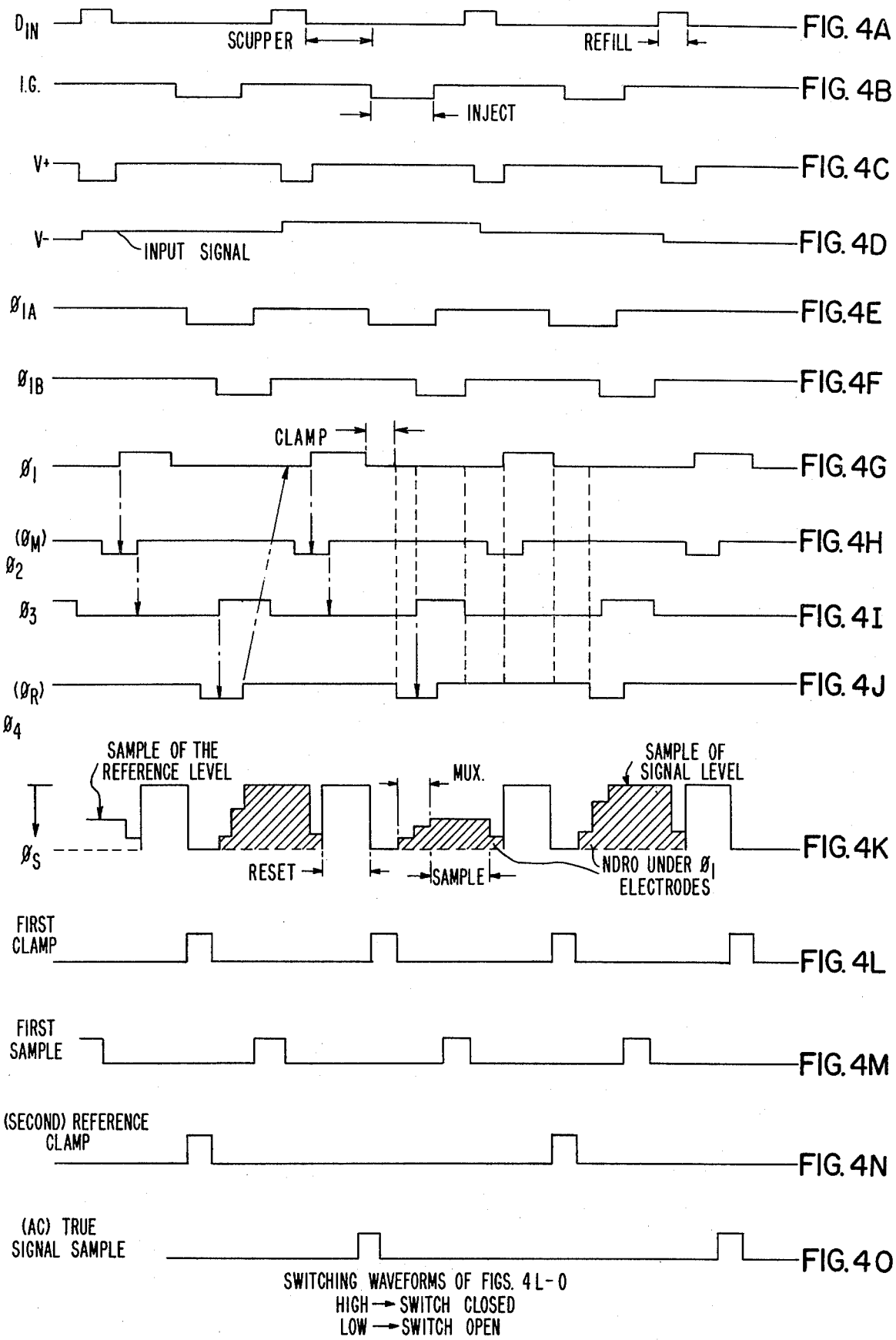

▨ EXCESS CHARGES, SCUPPERED TO SET(+) SIGNAL CHARGE LIMIT.

▨ SIGNAL CHARGES

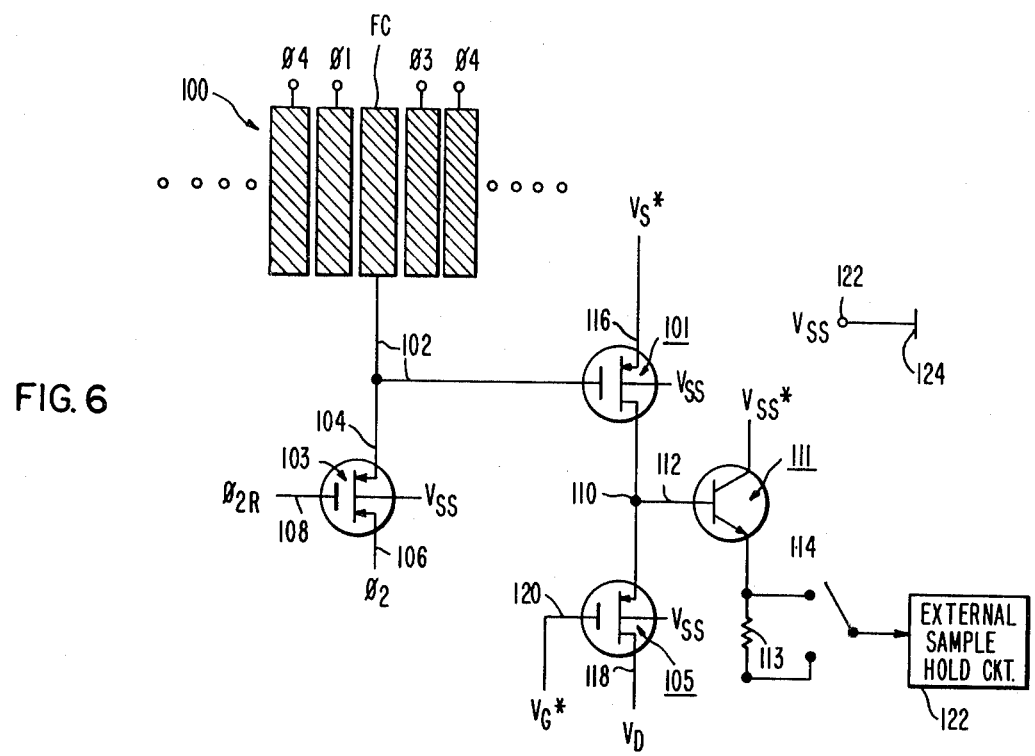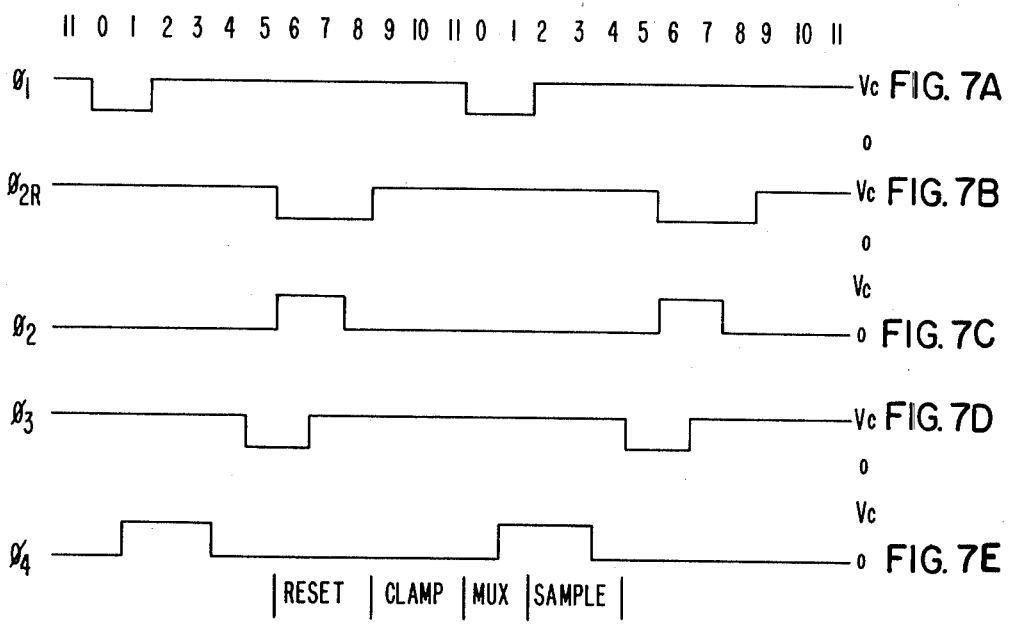

DUAL-CCD, REAL-TIME, FULLY-ANALOG CORRELATOR

BACKGROUND OF THE INVENTION

1. Field of the Invention

This invention relates to discreet analog signal processing systems (DASP) and, more particularly, to a specific such system employing CCD devices configured for implementing a dual-CCD, real-time, fully-analog correlator.

2. State of the Prior Art

General requirements of digital analog signal processing (DASP) systems and relationship thereto of charge transfer devices (CTD) and specifically charge coupled devices (CCD):

In the prior art, digital signal processing (DSP) has been utilized in many applications in view of the low cost of the integrated circuits that are available to perform many functions in digital fashion. As compared with analog techniques, DSP has been preferred in that its use of digital implementation has been considered to be preferable in view of cost, weight, flexibility and accuracy considerations. By contrast, the only present advantage of analog techniques is its lower power consumption, which advantage may gradually disappear as technology advances. A further technique known as discrete analog signal processing (DASP) provides an alternative to the aforementioned methods of signal processing and is implemented by sampling at regular intervals an analog signal to provide a series of analog signals or samples, each of which may be operated upon one-at-a-time and have an amplitude containing information on data corresponding to M digital bits, where one bit of resolution in DSP is equivalent to 6dB dynamic range in the analog signal. Experiments have shown that a signal-charge analog packet can be shifted through a typical CTD nearly unattenuated, limited by the size of the holding wells and the minimum detectable output signal.

As more fully described in an article entitled "Charge Coupled Semiconductor Devices" appearing in *Bell System Technical Journal*, April 1970, by W. S. Boyle and G. E. Smith, CCD's sample an analog input signal to povide a series of discrete analog charge packets to be stored in potential wells created at the surface of a semiconductor and transported along the surface by timing signals. More particularly, these charges constitute minority carriers stored at the silicon-silicon dioxide interface of capacitors and are transferred from capacitor or well to capacitor or well on the same substrate by manipulating the voltages applied across the capacitor.

Practical applications of CCD systems however present various requirements, some among these being the ability of creating a basic building-block approach to the use of CCD processing devices to permit commercially feasible use of these devices in implementing complete systems having commercial appeal. Specifically, it must be made possible to achieve a compatable wedding of individual CCD subsystems to achieve a functioning and practical CCD system having commercial appeal and practicability.

CCD technology as well differs from prior art DSP technology and is only currently emerging as a possible, commercially feasible approach to implementing large, sophisticated systems. The inherent characteristics of CCD subsystems present certain operating requirements which must be considered in implementing a CCD system having a practical application, and it is therefore instructive to review these considerations at this juncture. For example, CCD analog signal processing depends upon the following device functions:

1. Linear signal (charge) injection with low noise insertion. This is of particular significance since the signal to be injected is a voltage signal and can give rise to noise in the injection operation if proper device structure and control functions are not achieved.

2. Precise signal (charge) transport delay with load dispersion (load transfer inefficiency, $\epsilon$) and high dynamic range (charge handling capability and noise). In this context, again proper design and operation are of critical importance to achieve satisfactory results in the signal processing functions.

3. Recognizing that CCD devices are charge transport or charge coupled devices and require constant manipulation or constant propagation of the charge packets, it also will be appreciated that the capability of reading out the data, i.e. sensing the data represented by the charge packets, must be performed in a manner so as not to alter or affect the charge packet and hence the information content. This observation relates, for example, to the need to derive parallel outputs from a shift register through which the charge packets are propagating - some applications of course permitting destructive readouts such as in a serial readout (SI) mode. Where parallel outputs, for example, must be derived at tapped locations along a delay line as implemented by a CCD shift register, non-destructive readout (NDRO) of the analog signal at these tapped locations is of critical importance. In addition to the ability to read out the data non-destructively, it must also be recognized that any sampling function itself introduces noise, termed the Nyquist noise, especially at the signal amplitude levels involved in CCD technology and/or in relation to typical applications of CCD technology wherein signal to noise ratios of the signals to be processed are extremely low, it is of great importance to eliminate such sampling noise in the output. Elimination of that noise, however, will require a system compatible with sample and hold limitations.

4. Typical applications of CCD systems include linear transform operations wherein analog multiplicative weighting of the NDRO signal must be performed in relation to a second analog signal (or reference). A complete circuit, such as for repetitive inclusion in a correlator device must provide suitable buffering and mutliplying capability and must be capable of correcting for various device limitations including nonlinearities in bias levels inherent to CCD's. Where analog multiplicative weighting is required, the weighting cell must have the desired multiplier accuracy, linearity and speed of operation, and a fabrication requirement compatible with the associated CCD. It follows in such applications that a suitable source of the reference or multiplier level for the various weighting cells must be available independently. Such applications typically require, as well, a current summing amplifier — again this device must be compatible and, for example, must have a sufficiently low impedance to prevent interaction between all the parallel weighting cells, must not present unacceptable "loading" and must provide adequate buffering for the output of the transform operator in supplying the CCD output to an "off-chip" use device.

The prior art has not afforded the necessary development of CCD technology on all of these necessary specific areas nor has it fully achieved the compatibility of existing systems for rendering large-scale system implementations practical in all respects. The present invention, on the other hand, is directed to achieving all those goals of CCD technology as set forth above and provides a practical implementation of a complex system, and particularly a dual-CCD, fully analog, real-time correlator having numerous practical applications. The system of the invention demonstrates a building block approach to the implementation of practical CCD systems and has substantial merit for that accomplishment as well. At this juncture, certain aspects of the prior art as relate to specific components or subsystems of the correlator system of the present invention are considered in somewhat more detail.

CCD Charge Injection

To date, low-noise charge injection into CCD's is achieved by two basic techniques — one involves a floating junction which can inject only small quantities of charge linearly or large charge packets non-linearly. A second technique can inject only small charge packets linearly with low noise or large charge packets at the price of increased noise. The latter technique typically involves a diffusion charge injector structure which is operated as a reverse biassed diode. The capacitance value of the diode in this instance is a function of the level of signal voltage applied. Hence, the prior art diffusion-type charge injector structure introduces non-linearities and noise in the charge injection function as a result of the signal voltage-dependent capacitance value thereof.

Low noise charge injection is extremely important to proper operation of CCD structures, since for signal processing the charge injection is controlled by electrical injection, not optical injection. In general, the prior art has not provided adequate charge injection techniques or structures affording sufficient stability and linearity to meet the demands of CCD systems.

Charge Sensing From CCD Devices

One technique, typically employed for destructive sensing, is to provide a diffused sensing region at the point of readout from the CCD channel. In some versions, diffused sensing regions have been provided which attempt to afford nondestructive readout. This technique is basically ineffective since there is charge retention on the diffused sensing node which, expressed in terms of inefficient transfer of signal charge from the diffused region, gives rise to considerable signal dispersion.

An isolated floating gate electrode technique has also been employed heretofore in the prior art. Known techniques, however, provide that the gate electrode employed for sensing remain in a floating condition at all times. This has several disadvantages, a principal one being that there is inadequate control over the potential of the isolated floating gate sensor electrode and hence inadequate control of the surface potential in the CCD channel underlying that sensor electrode. Elaborate and complex circuit provisions are required to compensate for this condition, themselves introducing diverse other problems. Non-destructive split-clock-type sensing used in conjunction with preweighted summation over all readouts (tap-points) of a CTD requires gated integration of clock line currents and does not permit independent buffered access to each tap-point.

Error Correction for Analog Signal Processing Systems And Specifically For CCD Systems It has been known heretofore in the prior art to utilize a zero reference in conjunction with an analog signal to provide more accurate interpretation of the analog signal levels. Voltage drift and bias errors, of course, exist in any type of analog circuit. For example, in telemetry, a so-called "return-to-zero" technique has long been known in which alternate signal and reference samples are transmitted, such as from a satellite to a ground station. This technique permits correction of voltage drift and bias errors at the receiver by subtracting the received zero reference from the received signal sample.

U.S. Pat. No. 3,781,574 — White et al., assigned to the common assignee, discloses a coherent sampled read-out circuit and signal processor. In one embodiment disclosed in the patent, this circuit and processor are coupled to a CCD shift register. In fact, the circuit and processor of the patent have applicability to any type of device from which an analog charge signal readout is to be obtained, for purposes of minimizing the degradation of the readout signal and minimizing any noise contribution due to the readout operation. The term coherent sampling as employed in that patent corresponds to a term employed herein of "correlated double sampling" (CDS). The technique of the U.S. Pat. No. 3,781,574 relates principally to output operations and hence may be applied to any system producing an analog charge output such as diode arrays, and CTD, including CCD, systems.

Cross-Reference to Related, Pending Applications

Several applications co-pending herewith, all assigned to the common assignee hereof, are of interest.

Aplication Ser. No. 507,115 filed Sept. 18, 1975, entitled "A Programmable Analog Transversal Filter" of Lampe, et al., is of interest for its disclosure of a system implementation of CCD technology. This application is also pertinent to the above-noted requirements of CCD technology as will be apparent in the succeeding citation of various continuation-in-part appliations relating to that parent application.

Another applicaton of interest, Ser. No. 625,694 concurrently filed, and entitled "Extended Correlated Double Sampling for Charge Transfer Devices" of Lampe, et al., is of interest for its disclosure of extended correlated double sampling for correction of errors arising out of non-uniformities of threshold and leakage currents as well as bias variations, ECDS providing correction for all the sources of errors as may arise from the input to the output of a CCD system. Threshold non-uniformities and leakage current non-uniformities, of course, have effects similar to a bias error and, in effect, the output signal errors are indistinguishable as between originating from bias errors of threshold and leakage current non-uniformities. An early suggestion for achieveing cancellation of bias errors and drift consistent with the techniques of extended correlated double sampling is provided in an article entitled, "An Electrically Programmable LSI Transversal Filter for Discrete Analog Signal Processing (DASP)" by Lampe, et al, published in Proceedings, CCD Applications Conference 18-20, September 1973, San Diego, Calif. A comparison of the technique taught in the above-cited U.S. Pat. No. 3,781,574 assigned to the common assignee (termed herein coherent double sampling (CDS)) is perhaps warranted. CDS is directed to achieving optimum low noise signal outputs of analog devices, such as a CCD, by correlated double sampling and differencing of the noise inherent in the on-chip, gated charge integrator readout circuit, thereby eliminating this noise component from the video output. The ECDS technique expands this compensation or error correction capability to encompass the entire device, including input and output. Specifically, the ECDS technique permits cancellation of device threshold and leakage non-uniformities and bias errors.

A further teaching of interest is available from a concurrently filed application Ser. No. 625,701 entitled "Stabilized Charge Injector for Charge Coupled Devices" of Lampe, et al. As above noted, the ability to achieve linear charge injection into a CCD with minimum noise associated therewith is of critical importance to achieving practical and satisfactory CCD systems. The structures and techniques taught in the noted application are of great significance in accomplishing those objectives and are employed in the system of the present disclosure.

As previously discussed, the ability to achieve nondestructive sensing from a charge transfer device, such as a CCD shift regiser, is of critical importance. Structure and techniques for accomlishing the same are disclosed in a concurrently filed application Ser. No. 625,697 entitled "Floating Clock Sensor for Buffered Independent, Non-Descrutive Readout of Charge Transfer Devices" of Lampe, et al. The teachings disclosed therein are employed in the presently disclosed system as well.

The above cited concurrently filed applications are continuations-in-part of the first cited application Ser. No. 507,115.

The ability to provide diverse type solid state devices in a common monolithic structure is also of substantial importance to achieving practical CCD systems. A structure and process for accomplishing that structure are disclosed in the concurrently filed application Ser. No. 625,719 entitled "Monolithic Semiconductor Structure and Processing Technique of Providing Structure for a Plurality Different Types of Solid-State Devices" of Lampe, et al. Monolithic structures as employed in the presently disclosed system may be accomplished in accordance with the teachings of that application.

Also of interest are concurrently filed applications Ser. No. 625,691 entitled "Analog Transversal Filtering and Correlation With Progressive Summation of Analog Signals" of Lampe et al, and Ser. No. 625,702 entitled "CCD Focal Plane Processor for Moving Target Imaging" of Lampe et al.

--BRIEF DESCRIPTION OF THE DRAWINGS

FIGS. 4A through 4O are waveforms of control and other signals, FIG. 4K being a waveform illustrating potential well conditions in a manner similar to FIG. 2B;

FIG. 6 is a schematic of a floating clock sensor technique for non-destructive readout from a CCD, shown in a parallel output (PO) configuration and useful with ECDS;

FIGS. 7A through 7E comprise waveforms of control signals utilized for operation of the circuit of FIG. 6;

DETAILED DESCRIPTION OF THE PREFERRED EMBODIMENT

Figure 8:
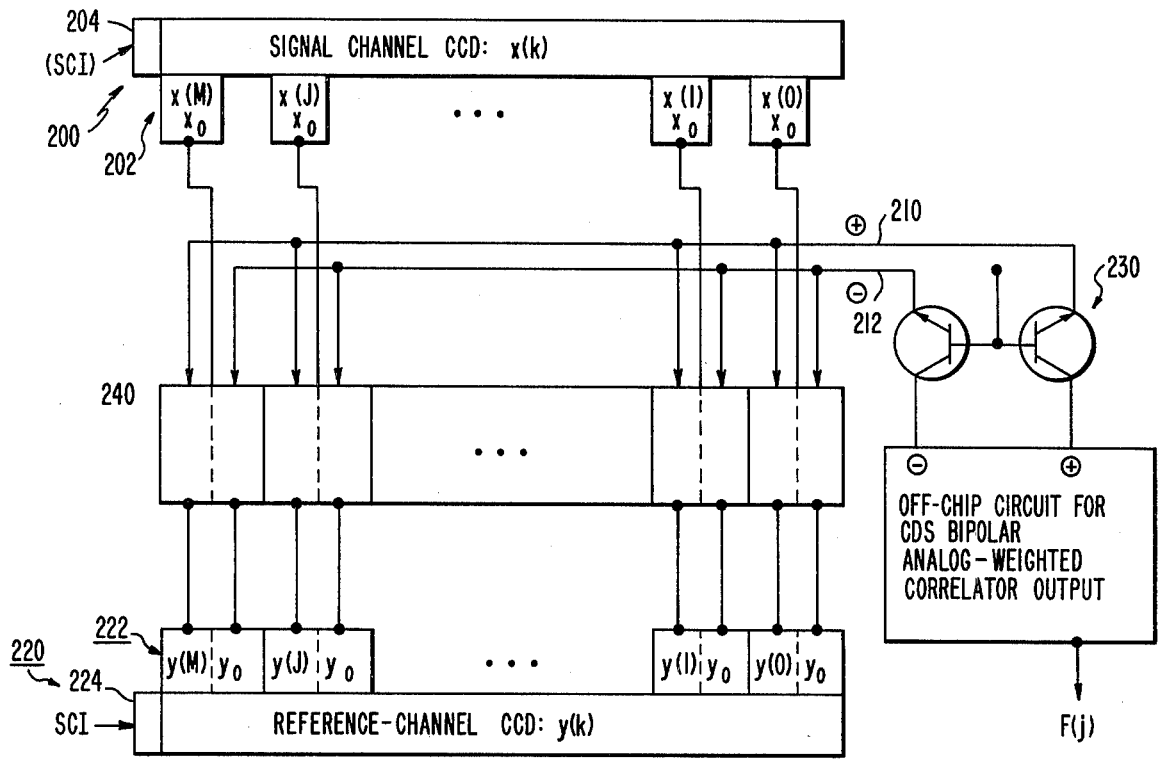
FIG. 8 is a diagrammatic representation of a signal channel CCD and reference-channel CCD, for use in analog multiplication of a signal by a reference.

A general-purpose, fully-analog correlator device, as illustrated in FIG. 8, is capable of such functions as autocorrelation, cross-correlation, convolution, transversal filtering, etc. at high speeds (one megahertz typical sample rates) with no analog-to-digital or digital-to-analog conversions. The device correlates analog samples in one CCD channel 200 against analog samples in a second CCD channel 220 by means of analog multiplier cells 240 comprising balanced MOSFET's which multiply the associated voltage samples from the CCD's 200 and 220 to give current products that are summed for all multipliers. The current summing amplifier (NPN lateral bipolar transistors) is schematically shown at 230.

The two CCD channels 200 and 220 include unique floating clock sensors and buffer circuits shown at 202 and 222 which sense the CCD charge samples without affecting the efficiency of their propagation along the respective CCD shift registers 200 and 220. The matched MOSFET multipliers 240 and current summing amplifiers 230 are also uniquely combined in a dual-differential configuration so as to minimize the effects of sampling errors and dark current accumulation within the CCD's 200 and 220. Polysilicon gates and field shields are used throughout, as later described, to facilitate high-density design rules which are needed to give the smaller cell dimensions required to match the nondestructive sensing and buffering cells and the balanced differential multiplier cells 240 with the longitudinal dimensions of the CCD cells of the channels 200 and 220, which must be small for efficient high-speed propagation.

The output F(j) of the correlator circuit of FIG. 8 may be expressed as:

$$F(j) = \sum_{J=0}^{M} \alpha \cdot x_s(J+j) \cdot y_s(J) \text{ where time} = \quad (1)$$

$$T_c = \frac{L_o + NT_c}{CCD \text{ Clock Period}} \text{ with}$$

A general-purpose fully-analog correlator is a very powerful signal processing element. The convolution operation is quite familiar in the field of filtering:

$$g(i) = \sum_{J=0}^{N} h(J) \cdot f(i - J) \quad (2)$$

where $h(J)$ describes the impulse response of the nonrecursive filter referenced to system zero, and $f(j)$ describes the input signal referenced to system zero as sampled in time To exemplify an application of the correlator of FIG. 8, consider the following example. The standard methods for performing spectral analysis involve the computation of lagged products of the form:

$$F(j) = \sum_{J=0}^{M} x(J+j) \cdot y(J) \quad (2')$$

(correlation, autocorrelation)

which are related to power spectrum estimates. Regarding the analog correlator device illustrated in FIG. 8 the signal, $x(j)$, may be stored in the signal channel CCD 200 with the function, $y(J)$, stored in the reference channel CCD 220. To easily visualize the corresponding convolution operation, one reverses the propagation direction in either channel; e.g. the stabilized charge injector (SCI) 224 would be at the right end of the reference channel 220 with the clocks propagating charge to the left.

Realization of the proposed analog correlator device of FIG. 8 consists of several distinct items:

(1) CCD shift register input
(2) Device output
(3) Nondestructive sensing
(4) Multiplication of signal by reference
(5) Summation of the products of signal times reference.

Each item will now be covered separately. General Description of CCD and Stabilized Charge Injection (SCI)

Figure 1A:
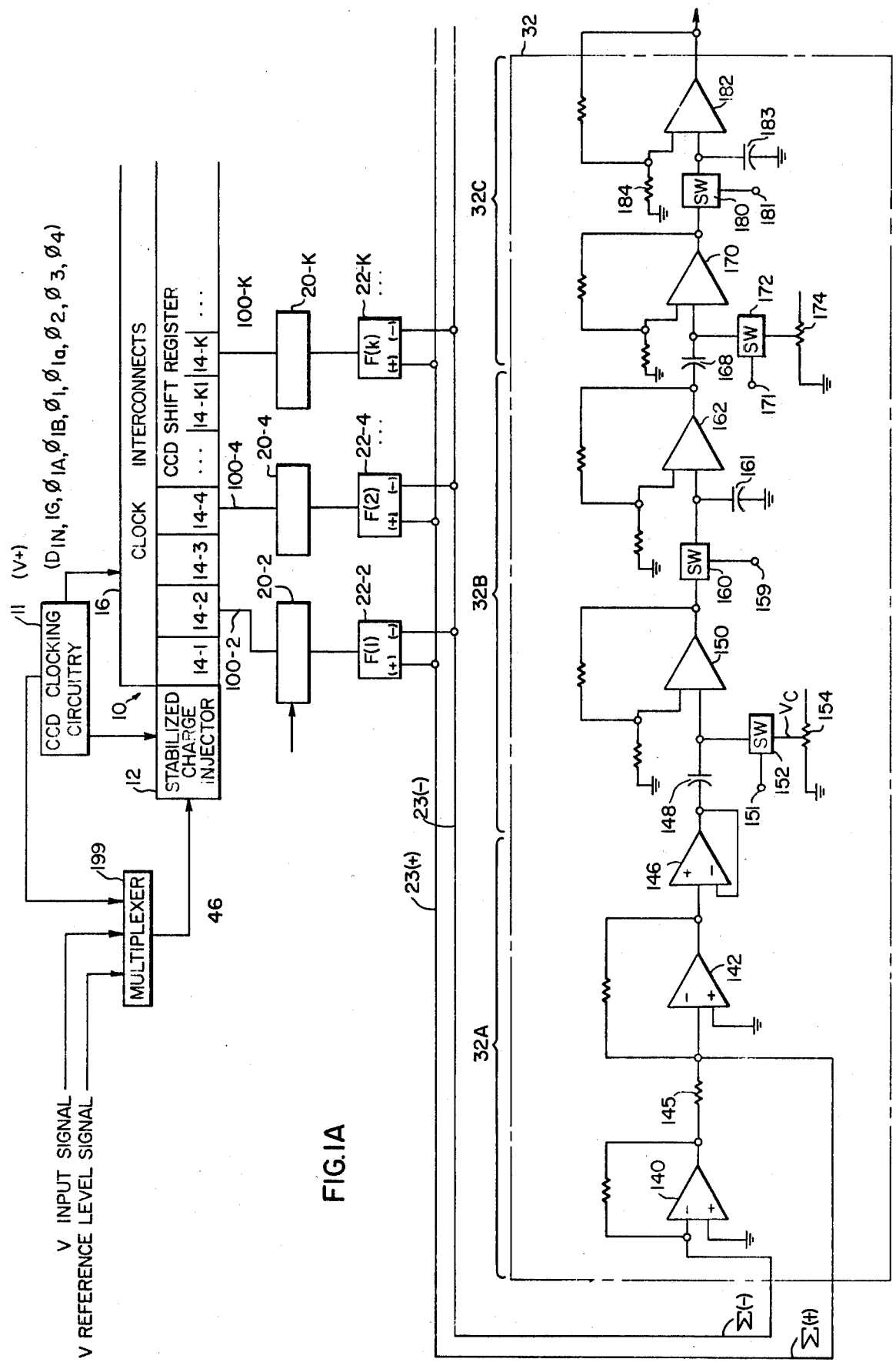
FIG. 1A is a schematic, partly in block diagram form, of a CTD and specifically a CCD system incorporating ECDS in accordance with the invention.

FIG. 1A of the drawings illustrates in schematic form a discrete analog processing system in accordance with the teachings of this invention and comprising a charge transfer device illustratively taking the form of a charge coupled device 10 (CCD) and including a stabilized charge injector 12 for injecting the input signal charges into the CCD 10. A CCD master clock circuit 11 provides suitable clock signals for operation of the injector 12 and the CCD shift register 10 through the clock interconnects 16, in known fashion. The clocking circuitry 11 provides a number of output signals as indicated in FIG. 1A, including four-phase clocks $\phi 1$ through $\phi 4$. These various signals are shown and discussed in relation to FIGS. 4A through 4J.

The CCD shift register 10 includes a plurality of stages through which the charge packets are propagated under control of the clocking signals, those stages shown as 14-1, 14-2, ... in FIG. 1.

Figure 1B:
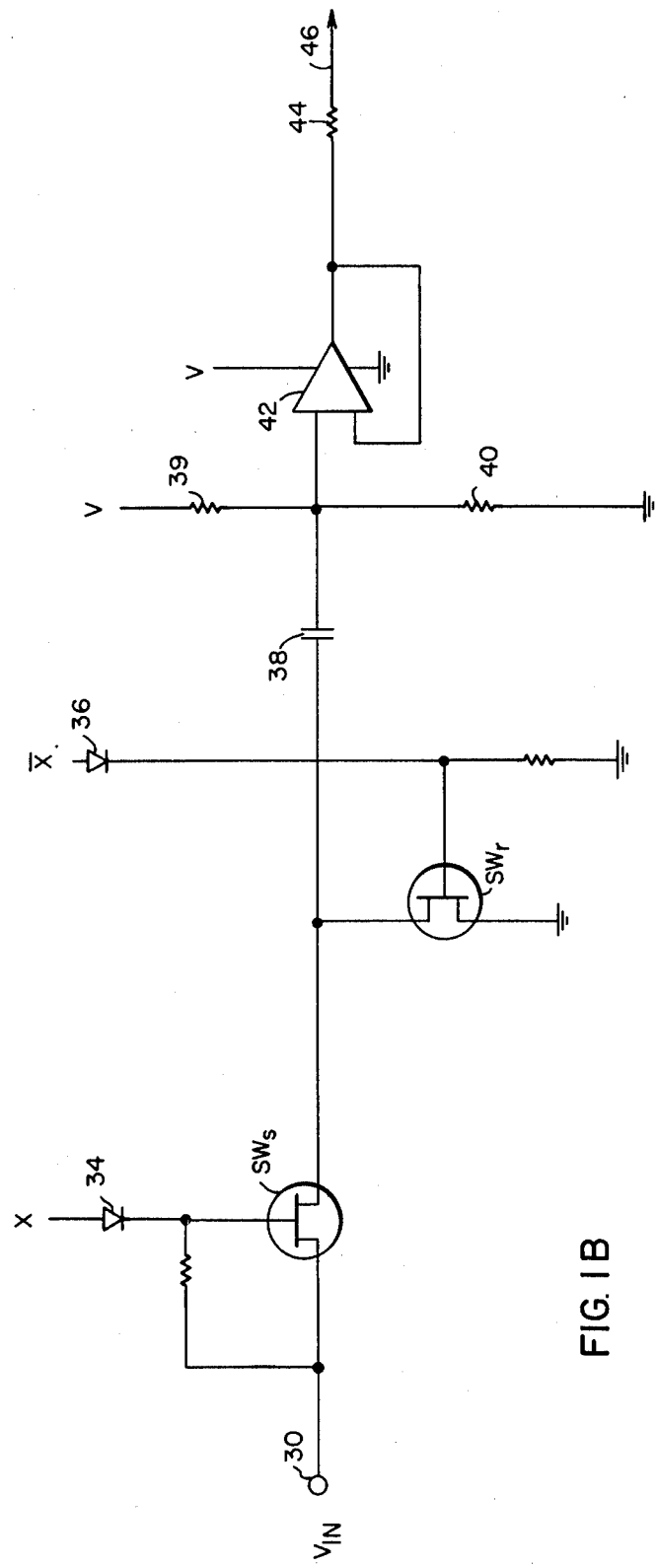
FIG. 1B is an illustrative schematic of a multiplexer employed in FIG. 1A for alternate injection of signal and reference level signals into the CCD in accordance with the CDS.
Figure 2A:
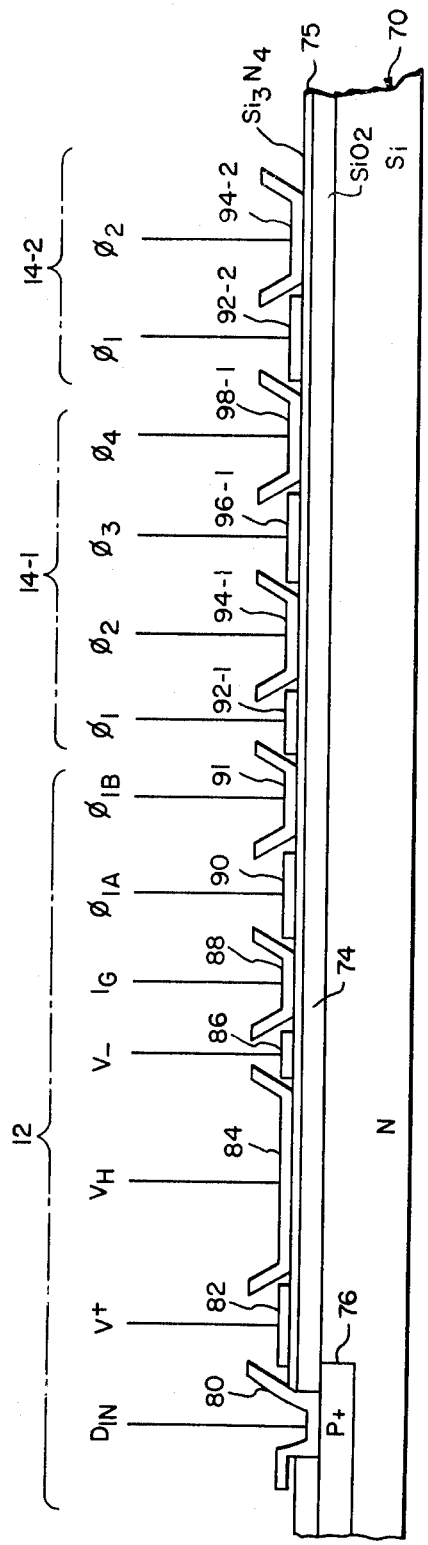
FIG. 2A is an illustrative cross-section, partly in schematic form, of a CCD channel and associated electrodes including the structure related to a stabalized charge injector (SCI)

FIG. 2A is a schematic cross-sectional view of the stabilized charge injector 12 and the first two stages 14-1 and 14-2 of the CCD shift register 10 of FIG. 1. As shown, a substrate 70 of silicon (which may be an epitaxial layer on a further substrate) includes a P+ type source region 76 formed within the substrate 70 and a source contact 80 formed through a window in a silicon dioxide layer 74 and a silicon nitride layer 75, in direct contact with the region 76. Signal injection is achieved primarily through the use of the electrodes 80, 82, 84, 86 and 88, to 82, 84 and 86 of which the biasing potentials V+, $V_H$ and V− are applied. Generally, the voltage signals V+ and V− as shown in FIGS. 4C and 4D, respectively, establish a charge distribution as seen in FIGS. 3A to 3D within the silicon substrate layer 70. In particular, the input signal is applied to either the V+ electrode 82 or the V− electrode 86, for the control of the injection of the charge packets into the first and subsequent wells of the CCD 10. $\phi_{1A}$ and $\phi_{1B}$ electrodes are provided to facilitate the injection of the large amounts of charge needed for the maximum allowable propagating charge packet, $Q_{MAX}$. The injected charge then is transferred successively beneath the $\phi 1$, $\phi 2$, $\phi 3$ and $\phi 4$ electrodes of the successive groups 14 to be transferred along the length of CCD 10. The various signals applied to the electrodes of the stabilized charge injector 12 as well as the shift register portion of the CCD 10 are shown in FIGS. 4A to 4J.

Figure 3A:
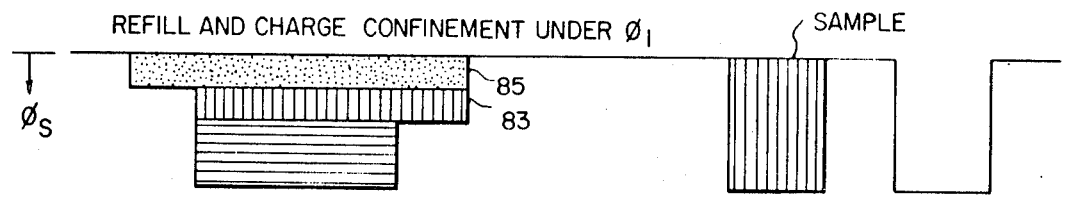
FIGS. 3A through 3D are more detailed views as in FIG. 2B illustrating successive SCI operation.

The first or refill step of injecting the signal into the CCD 10 is shown in FIGS. 3A and 4A by pulsing the DIN electrode 80 to a potential near the potential of the substrate 70. During the refill phase as shown in FIG. 3A, the charge uncertainty is limited by the following equation:

$$q_n^2 = kT(C_+ + C_H + C_-) \quad (3)$$

Figure 3B:
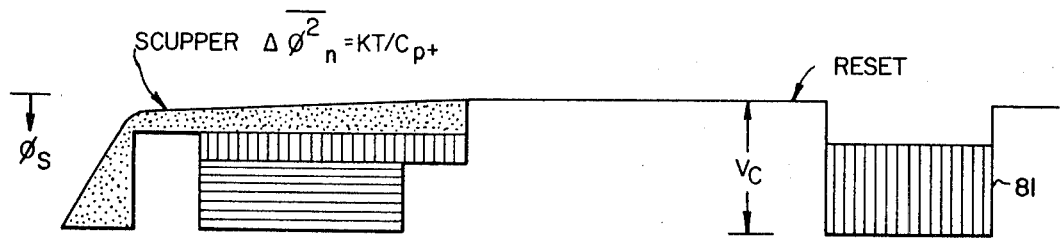

These charge fluctuations are meaningless since in the next step as shown in FIG. 3B, the minority carriers near that charge level are drained or "scuppered" from the upper part 85 of the well established beneath the electrodes 84 and 86 back into the P+ diffusion region 76, which now is reverse-biased, until the charge level within the well 83 underneath the electrodes 84 and 86 reaches the voltage level as applied to the V+ gate electrode 82. In other words, all of the excess charges including those which give rise to the population variation or randomness as expressed in equation (3), are scuppered into the drain region 78 until the surface potential at the $V_H$ and V− electrodes 82 and 86 equals the surface potential underneath the V+ electrode, which has noise fluctuations given by the equation:

$$\overline{\Delta \phi_n^2} = kT/C_{P+} \quad (4)$$

where $C_{P+}$, $C_{P-}$ and $C_{PH}$ equal the total on-chip plus off-chip capacitances at the nodes associated with the V+ electrode 82, the V− electrode 86 and the $V_H$ electrode 84, respectively.

As seen in FIGS. 2A and 4A, the source diffusion 76 is biased by the voltage applied to the electrode 80, whereby all the minority carriers near the charge level as given in the equation (3) within the well formed beneath the electrodes 82, 84 and 86 as shown in FIG. 3B, are drained or "scuppered" back into the diffusion region 76. At the end of the "scupper" process, the excess or random charges have been removed from this uppermost part 85 of the well beneath the electrodes 82, 84 and 86.

Next, the injection gate is enabled by applying a negative-going inject pulse IG as shown in FIG. 4B to the injection gate electrode 88, whereby positive charges are permitted to flow into the first receiving well 89 beneath the IG electrode 88, the $\phi_{1A}$ electrode 90 and $\phi_{1B}$ electrode 91, and $\phi_1$ electrode 92-1. The minority carriers continue to flow until the surface potential beneath the $V_H$ electrode 84 equals the surface potential beneath the electrode V— (86), which has a potential noise fluctuation in accordance with the equation:

$$\overline{\Delta \phi_n^2} = kT/C_{P-} \qquad (5)$$

Electrode 84 may be electrically connected to electrode 86 or an independent negative voltage may be applied to electrode 84 to establish a depletion region which acts as a minority carrier holding well 93. During this injection period, any potential fluctuation on the $V_H$ electrode 84 injects undesired charge randomness given by the equation:

$$q_n = C_H \cdot \Delta \phi_n, \text{ where } \overline{\Delta \phi_n^2} = kT/C_{PH} \qquad (6)$$

Figure 3C:
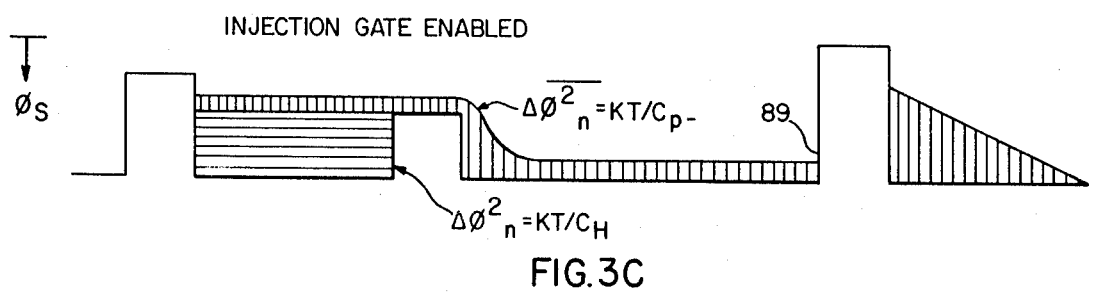

The input signal as shown in FIG. 4D may be applied to either the V+ electrode 82 or the V— electrode 86 whereby the quantity of charges permitted to flow into the well 89 is controlled as shown in FIG. 3C. Further, equations (4), (5) and (6), as given above, may be expressed as follows:

$$Q_{SIG} = (C_H + C_-)(V_+ - V_-) \qquad (7)$$

and $$q_n^2 = (C_H + C_-)^2 \cdot (kT/C_{P+}) + (C_H + C_-)^2 \cdot (kT/C_{P-}) + C_H^2 \cdot (kT/C_{PH}) \qquad (8)$$

or $$g_n^2 \cong (C_H + C_-)^2 \cdot kT \cdot (C_{P+}^{-1} + C_{P-}^{-1} + C_{PH}^{-1}) \qquad (9)$$

The last factor of equation (9) is simply the equivalent series combination of the total off-chip parasitic and on-chip capacitance at the V+ electrode 82, $V_H$ electrode 84 and V— electrode 86, which may be expressed by the term $C_P$, permitting the following equation:

$$q_n = (C_H + C_-) \cdot (kT/C_P)^{\frac{1}{2}} \qquad (10)$$

In Fig. 2A there is shown electrodes $\phi_{1A}$ and $\phi_{1B}$ 90 and 91 which facilitate the injection of large amounts of charge into the well 89 therebeneath to permit the maximum allowable propagating charge packet $Q_{MAX}$. As seen in FIGS. 4E and 4F, negative-going pulses are applied to the electrodes 90 and 91 during the injection step, whereby a maximum amount of charges are disposed in the well 89. If $V_C$ denotes the surface potential differences generated by the clock signals $\phi_1$ to $\phi_4$ and $V^1$ indicates the surface potential when $Q_{MAX}$ is disposed within the region 89 underneath electrodes 91 and 92, the following relationship is obtained:

$$Q_{MAX} = C_1 \cdot V_C = (C_H + C_-)(V_+ - V_-) = (C_{1A} + C_1) \cdot (V_C - V^1) \qquad (11)$$

Figure 3D:
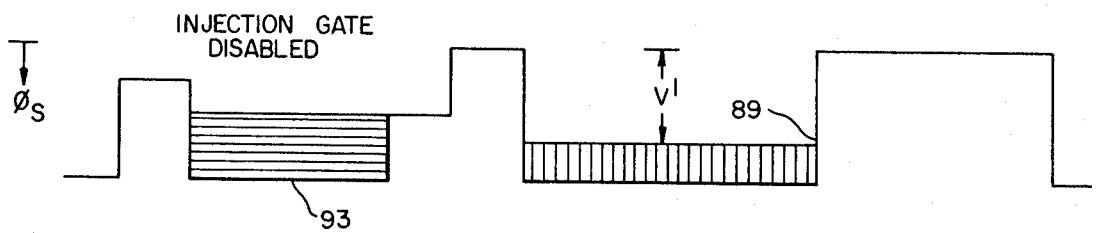

In the final step of operation as shown in FIG. 3D, the injection gate is disabled when the injection gate signal as shown in FIG. 4B returns to a more positive level, thereby raising a barrier across which the charges do not flow back into the holding well 93 beneath the electrode 84; if the charges were permitted to flow back, an extra uncertainty would be introduced into the signal processing. The barrier potential must rise slowly compared to the speed of charge flow forward into the receiving well 89. To help this forward flow of charges, the effective drain potential $V^1$, must be kept sufficiently below the effective source potential V— to provide the desired longitudinal drift fields for moving the charge forward in accordance with the following equation:

$$(V_+ - V_-) - V^1 > V_{MIN} \qquad (12)$$

From equations (11) and (12), the capacitances are selected and thereby the area of the corresponding electrodes in the formation of the integrated circuit.

Figure 2B:
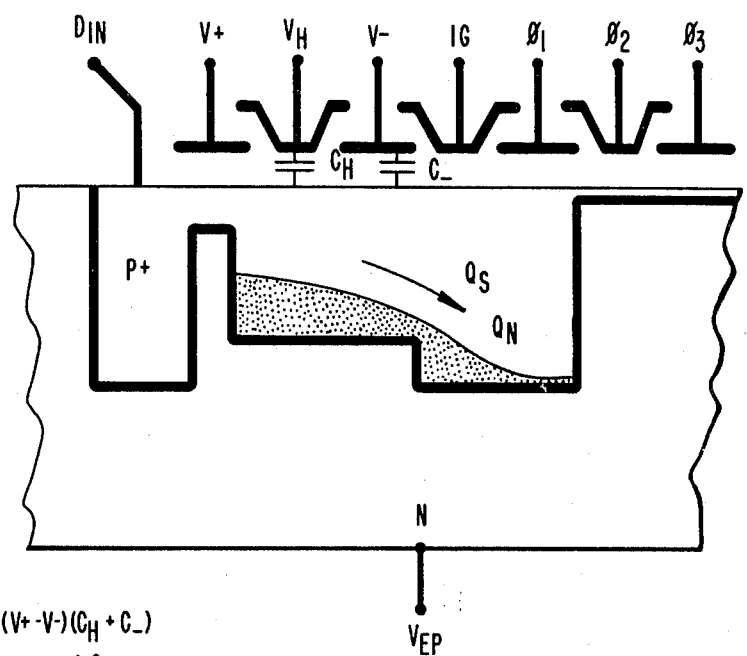
FIG. 2B is a schematic illustration of the SCI including illustrative potential well conditions during SCI operation.

From equations (7) and (11), it is seen that the amount of charge injected is linearly related to the input signal voltage V— as shown in FIG. 4D by the factor of the capacitances ($C_H$ + C—). Since these capacitances are essentially determined by the characteristics of the silicon dioxide layer 74 and the silicon nitride layer 75, they are independent of the charge storage potential applied, giving the desired signal-voltage-to-injected-charge linearity to thereby meet one of the requirements for DASP. (See FIG. 2B, schematically showing the input capacitances).

After the charge packet has been transferred into the well beneath the $\phi_1$ electrode 92-1 of the first cell 14-1, the charge packet is transferred from well to well along the linear length of the CCD 10 under control of the phase clock signals $\phi_1$, $\phi_2$, $\phi_3$ and $\phi_4$, as shown respectively in FIGS. 4G to 4J. It is understood that the $\phi_1$, $\phi_2$, $\phi_3$ and $\phi_4$ clock signals are applied to the corresponding electrodes 92, 94, 96 and 98 of each of cells 14 of the CCD 10. Generally, the charge packet is transferred from well to well by an attractive voltage (shown in the waveforms of FIGS. 4G to 4J as a relatively low amplitude) applied to the next electrode, and thereafter applying a repulsive voltage (shown in the voltage waveforms as a relatively high amplitude) to the well from which the minority charge carriers are attracted. The transfer of the charge carriers from well to well is generally shown in FIGS. 4G to 4J by arrows indicating that the carriers are transferred from well to well by successive application of attractive voltages ($\phi_1$ to $\phi_4$) to the corresponding successive electrodes; the charge packet is further transferred from the well underneath the $\phi_4$ electrode of one stage 14 to the well beneath the $\phi_1$ electrode of the next, successive stage 14.

Further experimentation with the CCD including the stabilized charge injector 12 as shown in FIG. 1 has revealed that improved operation is obtained if the gate electrodes 84 and 86 as seen in FIG. 2 are connected together for electrically common operation or as an alternative, are provided as a single electrode. Particularly, in the structure of FIG. 2, the bias voltage $V_H$ was a low, attractive voltage, typically in the range of the voltage $D_{IN}$ (i.e., the negative level value of the pulse voltage $D_{IN}$, $V_H$ being a steady DC bias value). The experimentation referred to revealed that the larger surface potential well produced by the separate voltage $V_H$ when applied to the separated electrode 84 introduced an increased charge uncertainty. This increased uncertainty can be visualized in the context that by having the two separately controlled electrodes 84 and 86, a large amount of charge and its associated noise was divided into two separate quantities under the respective electrodes. It was determined that the aforesaid electrical interconnection of the electrodes 84 and 85 avoids this increased charge uncertainty.

Figure 5A:
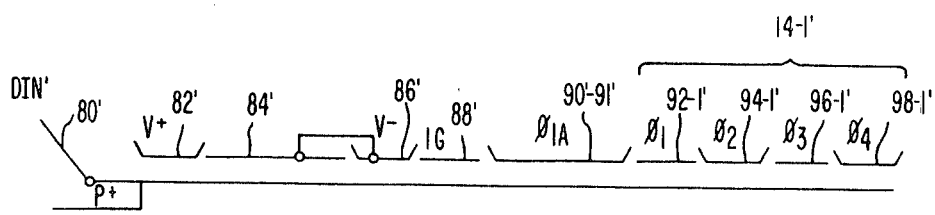
FIG. 5A is a schematic view of the cross-section of FIG. 2A.
Figure 5B:
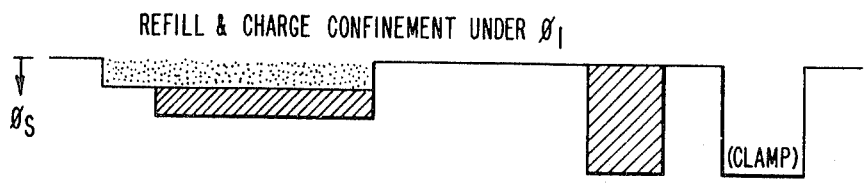
FIGS. 5B through 5E illustrate the resulting surface potential plots resulting from the modification disclosed in FIG. 5A.
Figure 5C:
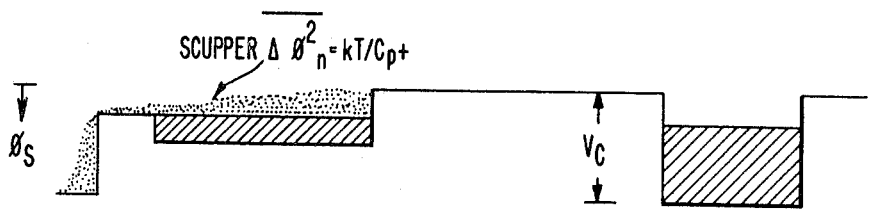
Figure 5D:
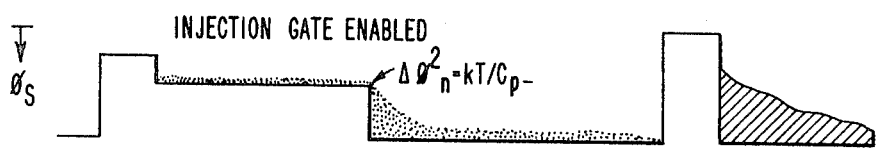
Figure 5E:
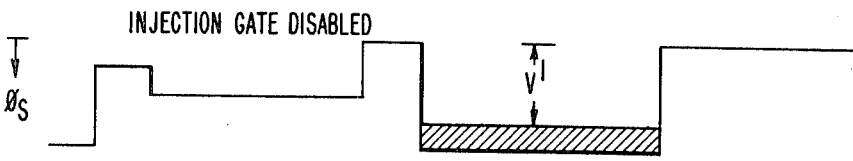

The further improvement of the SCI of this embodiment is now more fully appreciated with reference to FIGS. 5A through 5E. FIG. 5A is a schematic view of the cross section of FIG. 2 in which like parts are labeled with corresponding, but primed numerals. To emphasize the feature of interconnecting the electrodes 84 and 86 of FIG. 2, these are still shown as separate electrodes 84' and 86' in FIG. 5 with an electrical interconnection. It follows that the prior bias voltage $V_H$ has been eliminated and both electrodes are operated in common in accordance with the voltage V— which may comprise the signal input.

FIGS. 5B through 5E illustrate the resulting surface potential plots resulting from this modification disclosed in FIG. 5A and may be compared with FIGS. 3A through 3D, respectively. The comparison will reveal that the depth of the well under the now joined electrodes 84' and 86' has been reduced and, accordingly, the charge uncertainty and hence the noise as well has been reduced.

Extended Correlated Double Sampling (ECDS)

From the foregoing discussion of charge propagation in a CCD, it will be appreciated that certain sources of noise and/or errors in the output charge packet exist. These include non-uniformities of threshold and leakage current conditions within the successive wells of the CCD channel through which the charge packet propagates, and also bias errors such as may occur from drifting of the biasing sources. Compensation of these sources of error must be provided to achieve desired linearity and accuracy. The technique of the present invention provides the necessary correction for these errors. The technique is termed hereinafter ECDS, for "Extended Correlated Double Sampling". In general, ECDS provides for alternately injecting samples of the input signal and a reference level signal whereby the successive signal samples, or charge packets, are separated by the reference level signals, or charge packets. The reference level signals may be visualized as affording sample-to-sample isolation; equally valid is the visualization of same as affording isolation cells surrounding each signal cell. The reference signal level need not be alternated with all of the data sample signals, if reduced sample-to-sample isolation is acceptable, thus permitting only one reference signal for every predetermined number of signal samples instead to be employed. The following discussion, however, assumes that alternate reference and signal samples are propagated down the CCD Channel.

The only requirement on any auxiliary signal, i.e., the reference signal, carried in the isolation cells is that it not contribute a varying amount of charge to the succeeding data-carrying stages, which then becomes indistinguishable from the desired data. Any DC reference level fulfills that requirement, but a specially useful DC reference corresponds to the AC zero signal level. In this case, both the reference AC zero and the analog signal with reference bias appear sequentially interleaved at the CCD output.

Differencing the "reference only " and "signal plus reference" levels via the "clamp-sample-hold" technique of "extended correlated double sampling" (ECDS) then yields the desired error correction. Since both the "reference only" sample and "signal plus reference" sample follow the same path, they both interact with the same electrodes and thus give outputs determined by the same set of threshold voltages. Therefore output subtraction cancels any effects of MOS threshold non-uniformities and biasing errors with reduced sensitivity to leakage current non-uniformities. For applications where both samples dwell equally long at every point along their path, the leakage charge accumulated in both samples is identical and cancels exactly when the two samples are differenced at the output.

When the alternate reference level and signal level samples are employed, the sample-to-sample isolation above noted affords a further significant advantage in the reduction of crosstalk between successive signal samples. Specifically, the sample-to-sample isolation, $\epsilon$, as referred to the CCD, may be defined by the relative signal content of a CCD output charge packet:

$$\epsilon = \frac{\text{charge remaining from original signal sample}}{\text{charge added from preceding signal charge packets}}$$

Thus, $\epsilon$ is a measure of the extent to which one signal charge packet remains free from charge contributions from preceding signal charge packets corresponding to other independent samples of the signal. (The related phenomenon of crosstalk between signal samples occurs when a parallel-in/serial-out (PI/SO) CCD is used in a multiplexer.) Inadequate sample-to-sample isolation most generally results in degraded signal processing performance.

An illustrative implementation of ECDS is shown in FIGS. 1A and 1B and will be explained with reference to the waveforms of FIGS. 4K through 4O. In FIG. 1A, multiplexer 199 alternately samples the data signal labelled "V input signal" and the reference signal, labelled "V reference level signal" and supplies alternate samples thereof to the stabilized charge injector 12.

An illustrative implementation of the multiplexer 199 is shown in FIG. 1B; it is to be understood that the circuit elements of FIG. 1B may be provided in a monolithic structure with the CCD 10 and other elements shown in FIG. 1A.

In FIG. 1B, the V input signal is applied to the input signal node 30 and the V reference level signal is derived from the DC potential shown as a ground terminal. Transistor $SW_S$ is the signal sampling switch and transistor $SW_R$ is the reference level sampling switch, these transistor switches respectively being rendered conductive in alternate time intervals by the multiplexing signals X and $\overline{X}$ applied thereto through diode couplers 34 and 36. As noted, signals X and $\overline{X}$ are alternately enabling for their respective transistors so as to provide alternate signal and reference level signal samples. The samples are coupled through capacitor 38 and applied through biasing resistor divider 39, 40 to an input of an operational amplifier 42. Resistor 44 then receives the output of the amplifier 42 so as to apply these alternately selected signal and reference level signal samples to output line 46, which corresponds to the output from multiplexer 199, to the input of stabilized charge injector 12 in FIG. 1A.

The CCD 10 in FIG. 1A is shown as having parallel outputs 100-2, 100-4, . . . 100-K, . . . extending from alternate stages of the shift register 10 and, specifically, 14-2, 14-4, and 14-K. Output circuits 20-2, 20-4 and 20-K, respectively, receive the alternate input and reference level signals in successive time intervals as they appear at the outputs from the stages 14-2, 14-4, .... Transfer function circuits 22-2, 22-4, and 22-K receive the outputs from the corresponding output circuits and generate a prescribed output versus input. Differential outputs (shown as + and −) of the circuits may be supplied in common to summing busses 23 (+) and 23 (−), as indicated; or alternatively, a single-sided (non-differential) may be connected to a single summing bus.

Also shown in FIG 1A is a so-called analog reconstruction circuit 32. As will subsequently become clear, this circuit has the capability both of functioning to provide ECDS in accordance with the invention and in a manner compatible therewith, to provide CDS in a manner provided by the teachings of U.S. Pat. No. 3,781,574. To assist in visualizing the components of the circuit 32, (32A) comprises a differential input circuit for receiving the summed differential outputs of the circuit 22; portion 32B includes circuit elements for implementing CDS in accordance with the aforementioned patent No. 3,781,574, and section 32C comprises the ECDS portion of the circuit 32.

Rather than having two summed signals ($\Sigma$ (+) and ($\Sigma$ (−)), each of the parallel outputs 100-2, 100-4, ... 100-K from CCD 10 may be processed separately and specifically by a corresponding circuit 32. Also, a serial output from CCD 10 may be derived and processed by a single circuit 32. For parallel readout, non-destructive sensing of course is implied for most cases, whereas serial readout normally is destructive. As is apparent, the present invention requires the use of non-destructive readout, along with the multiplexing and summation functions as shown.

The operation of the circuit 32 will be more readily understood with reference to the waveforms of FIGS. 4K through 4O. FIG. 4K shows the alternate signal level and reference level charge packet distributions and their relative amplitudes. For the moment, both the signal and reference levels will be treated as signals for purposes of explaining the CDS circuit function.

As seen in FIGS. 4G through 4J, 4-phase clocking of the gate electrodes is employed. Moreover, the waveforms in the foregoing discussion assume that gate electrode $\phi_1$ is the sensor electrode. It furthermore is assumed for the parallel output shown in FIG. 1A that non-destructive sensing is being performed. Examples of suitable non-destructive sensing techniques are set forth hereinafter.

For the charge packet propagation shown in FIGS. 4G through 4J, it is seen that $\phi_1$ goes high or repulsive and, after $\phi_2$ goes high or repulsive (thereby isolating the $\phi_1$ electrode) $\phi_1$ again goes low or attractive. $\phi_4$ at this instant, however, is high or repulsive and hence the charge packet is confined under the $\phi_3$ electrode by both $\phi_2$ and $\phi_4$ being high. Moreover, the $\phi_1$ electrode well, though attractive, now is isolated from the charge being propagated and a reference level sensed from the $\phi_1$ electrode will be indicative of that condition. From FIG. 4L, a first clamp signal now is generated to clamp the voltage of a memory capacitor to the current $\phi_1$ level. The voltage developed in the memory capacitor will include the Nyquist noise from the sampling, or clamping function.

The charge subsequently propagates from $\phi_3$ to $\phi_1$: due to $\phi_4$ becoming attractive and $\phi_3$ going repulsive followed by $\phi_4$ going repulsive with $\phi_2$ also repulsive to confine the charge packet under the $\phi_1$ gate electrode.

Under this circumstance, the maximum charge packet is confined under the $\phi_1$ electrode — the appropriate time for sampling that signal level. Accordingly, as seen in FIG. 5M, a sample voltage pulse is generated for sampling the potential level of the $\phi_1$ electrode during this interval (i.e., while the maximum charge is confined under $\phi_1$). The signal sample then is compared in amplitude with the clamped voltage sensed from the $\phi_1$ electrode in the earlier interval when the $\phi_1$ electrode was isolated from the propagating charge package, and a difference signal is generated. Since Nyquist noise associated with the output reset operation is stored and remains essentially unchanged through the sample operation, the result difference then provides an output signal level which represents the true signal level, independent of the Nyquist noise.

FIG. 4K illustrates the charge distribution levels under the $\phi_1$ electrode for the signal pattern of alternate signal and reference level samples, in accordance with ECDS. As noted, the reference level conveniently is AC zero. Accordingly, the sampling function performed in accordance with the sampling waveform of FIG. 4F provides alternate signal level and reference level samples. The reference sampled in a first shift cycle of the CCD readout is stored on a memory capacitor and compared during the next cycle with the signal level sample. The difference therebetween then is taken as the output signal level sample from the CCD. It should be appreciated in this context that the Nyquist noise rejection is accomplished within each shift cycle of the CCD (i.e. as defined by the completed cycle of $\phi_1$ through $\phi_4$ for shifting a charge packet through and from one stage and into the next). Hence, each of the reference level sample and the signal level sample are corrected individually for the Nyquist noise error by the CDS technique.

The significance of ECDS will be readily appreciated when it is realized that each of the reference level and signal level samples propagates through the identical paths of the CCD. Hence, for a serial input charge injection as shown in FIG. 1A, each charge packet — both reference and signal — has the same residence time in each successive stage of the CCD shift register 10 and each is subjected to the same non-uniformities of threshold levels and leakage current and bias variations. The differencing of the reference and signal level samples of two successive cycles provides for elimination from the final output signal sample of errors occurring due to threshold and leakage current non-uniformities and bias level variations. Thus, full and complete correction for these sources of error is achieved by ECDS. Moreover, ECDS is fully compatible with CDS. The distinction of ECDS correcting for errors from the input to the output of the CCD as contrasted to CDS correcting only for Nyquist noise sampling at the output of any form of analog charge output device, as well, will be readily seen.

Referring again to the analog reconstruction circuit 32 of FIG. 1A, portion 32A comprises a differential input responsive to the differential outputs of the circuits 22 (from the summed input busses 23 thereof), portion 32B performs the CDS function for Nyquist noise cancellation in accordance with the teachings of U.S. Pat. No. 3,781,574, and portion 32C performs the ECDS function.

The differential outputs of circuits 22 from the busses 23, summed and of the relative polarities indicated, are applied to the operational amplifiers 140 and 142 and the differential output thereof is supplied through a further operational amplifier 146 which may serve as a buffer. Single-sided (non-differential) outputs from the function transfer circuits 22 applied to a single summing bus require only a single summing point operation amplifier in lieu of the differential scheme illustrated in circuit portion 32A.

In the CDS section 32B, switch 152 receives the first clamp signal of FIG. 4L at its input terminal 151. When the first clamp is low, switch 152 is open. At the (high) time of the first clamp, switch 152 closes to apply the DC signal bias level $V_C$ to capacitor 148. The potential on the $\phi_1$ electrode, which at this time is isolated from the charge packet, is sensed and the output thereof supplied across the bias established on capacitor 148 to operational amplifier 150. Note in this regard that the signal which is coupled to and stored across capacitor 148 represents the Nyquist noise resulting from this sampling function, since $\phi_1$ currently is isolated from the charge packet (see FIGS. 4G through 4J).

Switch 160 receives the "first sample" signal waveform of FIG. 4M and, accordingly, opens switch 160 to sample the signal level than on electrode $\phi_1$. For the combined ECDS/CDS system here under consideration, and comparing FIG. 4M with FIG. 4K, the first sample will be of a reference level. That sampled reference level is coupled through capacitor 148 and thus differenced with the Nyquist and bias ($V_C$) value signal stored on capacitor 148, and there is supplied through amplifier 150 to switch 160, corrected for the Nyquist sampling error. Switch 160 receives the "first sample" signal waveform of FIG. 4M, and supplies the Nyquist-correct reference level sample to the common node of memory capacitor 161, for storage thereon, and to the input of operational amplifier 162. The described CDS clamping and sampling operations repeat for each transfer cycle as seen in FIGS. 4L and 4M. Accordingly, the Nyquist noise level is again established on capacitor 148 and upon sampling of the signal level of FIG. 4K (i.e., in the next transfer cycle) the Nyquist noise-corrected, sampled signal level is coupled through operational amplifier 150 to switch 160. Again, switch 160 is closed by the "first sample" pulse waveform of FIG. 5M and the Nyquist-corrected signal level sample is stored on the storage capacitor 161.

Simultaneously with the next "first clamp" (FIG. 4L) following a reference level sampling, the second reference level clamp (FIG. 4N) occurs; the "second reference clamp" is applied to terminal 171 of switch 172 to close same. A circuit thus is completed to transfer the voltage stored on capacitor 161 (i.e., the reference level voltage) to capacitor 168 for storage thereon.

Switch 180 now receives and is closed by the (AC) true signal sample waveforms of FIG. 4O (occuring in the alternate cycles of the "second reference clamp" of FIG. 4N to complete a circuit from the storage capacitor 161 through amplifier 162, capacitor 168, and amplifier 170 to storage capacitor 183. The signal sample level on capacitor 161 thus is differenced against the reference level stored on capacitor 168 and the difference signal value stored on storage capacitor 183. Hence, operational amplifier 182 provides an output signal corrected both in accordance with CDS and ECDS.

Floating Clock Sensor (Non-destructive readout)

An example of a preferred form of a sensor for nondestructive readout of a CCD suitable for use herein is shown in FIG. 6, particularly comprising a floating clock sensor. The CCD 100 includes a plurality of successive gate electrodes individually labeled ... $\phi_4$, $\phi_1$, FC, $\phi_3$, and $\phi_4$. $\phi_1$, $\phi_2$ and $\phi_4$ represent a four-phase clock used to drive the CCD. The element FC is a floating clock electrode (corresponding to a $\phi_2$ electrode) from which data propagating down the CCD channel (i.e., in accordance with the four-phase clocking may be read out non-destructively. In general, the propagation of data through a CCD and the operation of such a device by four-phase clocking is well known. (See, for example, IEEE Journal of Solid-State Circuits, Special Issue, October 1975, "A Non-Volatile Charge-Addressed Memory (Novcam) Cell" by M. H. White, D. R. Lampe, J. L. Fagan, Francis C. Kub, and D. A. Barth, page 281 et seq. (especially the discussion at page 285).

The circuit associated with the floating clock electrode FC includes a transistor 103 operating as a clock reset switch, transistors 101 and 105 which, taken together, comprise a unigain inverter, and transistor 111 comprising a vertical, bipolar, emitter-follower.

The operation of the circuit of FIG. 6 will be more readily appreciated with respect to the waveforms of FIGS. 7A through 7E. (High levels are repulsive and low levels are attractive to the charge carriers of the illustrative CCD 100.) During the reset interval defined by $\phi 2R$ in FIG. 7B, transistor 103 conducts to couple $\phi 2$ to the floating clock electrode FC, first driving it repulsive (i.e., while high) to force charge toward the $\phi 3$ electrode. Next, as seen in FIG. 7D, $\phi 3$ becomes repulsive to put a barrier in front of the $\phi 2$ (FC) electrode. Then $\phi 2$ goes attractive, followed by the opening of the reset switch (transistor 103) upon $\phi 2R$ going high. The charge packet, however, is at this time confined in the $\phi 4$ electrode well, by $\phi 1$ and $\phi 3$ each being repulsive. The FC electrode well thus receives no charge, although attractive. $\phi 2R$ then terminates, concluding the reset interval and initiating the clamp interval, during which the attractive voltage of the FC electrode, representing the empty FC electrode well, is applied to the gate of the MOS amplifier 101; this level is clamped (stored) in the external sample/hold circuitry 122. Next, in "push-clock" fashion, $\phi_1$ goes attractive "muxing", or gating, the signal charge into the $\phi_2$ well followed by successive pulses of $\phi_4$ and $\phi_1$ going repulsive (i.e., the mux interval). At this time, both the $\phi_1$ and $\phi_3$ electrodes are high and therefore repulsive; as a result, the charge packet is stored in the FC electrode well, the FC electrode having remained attractive, although in a floating state, from the reset interval. Note, moreover, that $\phi 2R$ remains high, and hence the transistor switch 103 remains off, and $\phi_2$ is not coupled to the FC electrode. The sample interval thus initiates with $\phi_1$ going high, and terminates with $\phi_3$ becoming attractive, at which time charge begins to flow from the FC ($\phi_2$) electrode well to the $\phi_3$ electrode well. The sample interval, accordingly, is the time when the signal from the FC electrode is sampled in the external sample/hold circuitry 122.

The external sample and hold circuit 122 typically is connected to receive the output current from resistor 113 — that output current being a function of the voltage of the emitter output 144 of transistor 111 times the conductance of the resistor 113. Alternatively, a readout may be obtained from the output terminal label $v_o$ connected directly to the emitter 114. The sample and hold circuit 122 then compares the sensed signal with the previously stored clamped value of the FC electrode and determines the difference.

Circuit 122 of FIG. 6, of course, corresponds to circuit 32 of FIG. 1A. Whereas the waveforms of FIGS. 7A to 7E provide only for CDS operation of the circuit of FIG. 6, it is apparent that ECDS operation as well may be achieved, through the provision of the circuit portion 32c of FIG. 1A and the appropriate control waveforms.

Multiplication of Signal by Reference

As indicated in FIG. 8, the function required here is the analog multiplication of the signal times the reference. This may be accomplished in a variety of techniques, with more complex schemes used to ease current-driving requirements. Thus, for sake of clarity, we describe the simplest approach based on MOSFET multipliers illustrated in FIG. 9 and corresponding by primed numerals to elements of FIG. 8.

The drain current for a MOSFET operating in the triode is given by:

$$I_D = \mu C_o \cdot \frac{W}{L} \cdot \left[ V_{DS} \cdot \left[ V_{CS} - \phi_{MS} - \phi_S(\text{inv}) + \frac{C_{SS}}{C_o} \right] - \frac{V_{DS}^2}{2} - \frac{4\phi_F}{3} V_B \left( 1 + \frac{V_{DS}}{2\phi_F} - 1 \right) \right] \quad (13)$$

Applying the triode region limitation ($V_{DS} << V_{GS}$), we find:

$$I_D = \mu C_o \cdot \frac{W}{L} \cdot [V_{DS} \cdot (V_{CS} - V_T) + z(V_{DS})] \quad (14)$$

where $V_{DS}$ = source-drain potential difference, $V_{GS}$ = source-gate potential difference, $V_T$ = threshold voltage, $Z(V_{DS})$ = generalized non-linear contribution. We now use this equation to explain the overall multiplying action of the cell 240 shown in FIG. 9.

When the signal $x(j)$ is contained in the $j^{th}$ cell of the signal register 202 and the reference $y(j)$ is in the $j^{th}$ cell of the reference register 222 with the preceding sample of the system AC zero (AC/o) stored in the adjacent CCD cell for both the signal and the reference, the following equations obtain:

$$I_{j+} = \alpha_{j+} \cdot [y(j) \cdot [x(j) - V_{T+}] + z[y(j)]],$$

$$I_{j-} = \alpha_{j-} \cdot [y(AC/o) \cdot [x(j) - V_{T-}] + z[y(AC/o)]],$$

$$I_{j+}(o) = \alpha_{j+} \cdot [y(j) \cdot [x(AC/o) - V_{T+}] z[y(j)]], \text{ and}$$

$$I_{j-}(o) = \alpha_{j-} \cdot [y(AC/o) \cdot [x(AC/o) - V_{T-}] + z [y(AC/o)], \text{ where}$$

$$\alpha_{j\pm} = \mu[C_o \cdot (W/L)]_{j\pm} = \alpha + \delta\alpha_{j\pm} \text{ with } |\delta\alpha_{j\pm}| << \alpha. \quad (15)$$

The drain currents in each summing bus 210, 212 are converted to voltages by the current summing amplifiers 230 (see FIG. 8). Those voltages are subtracted in a differential amplifier; first with $x(AC/o)$, giving a value that is held and then subtracted* from the second current differential for $x(j)$:

Individual Cell Output $$= (I_{j+} - I_{j-}) - [I_{j+}(o) - I_{j-}(o)]$$

$$= [I_{j+} - I_{j+}(o)] - [I_{j-} - I_{j-}(o)]$$

$$= \alpha \cdot [x(j) - x(AC/o)] \cdot [y(j) - y(AC/o)]$$

$$+ [\delta\alpha_{j+} \cdot y(j) - \delta\alpha_{j-} \cdot y(AC/o)] \cdot [x(j) - x(AC/o)]$$

$$+ [\delta\alpha_{j+} \cdot z[y(j)] - \delta\alpha_{j-} \cdot z[y(AC/o)]] \quad (16)$$

The last two terms represent cell-to-cell variations arising from geometric fluctuations of ($C_o$ W/L) in the multiplier MOSFET's and may be minimized by careful design.

*This "clamp, sample, difference and hold" operation really constitutes a second level of correlated double sampling; previously explained for the internal CCD operation, with the signal-charged potential well referenced to an empty potential well.

Figure 9:
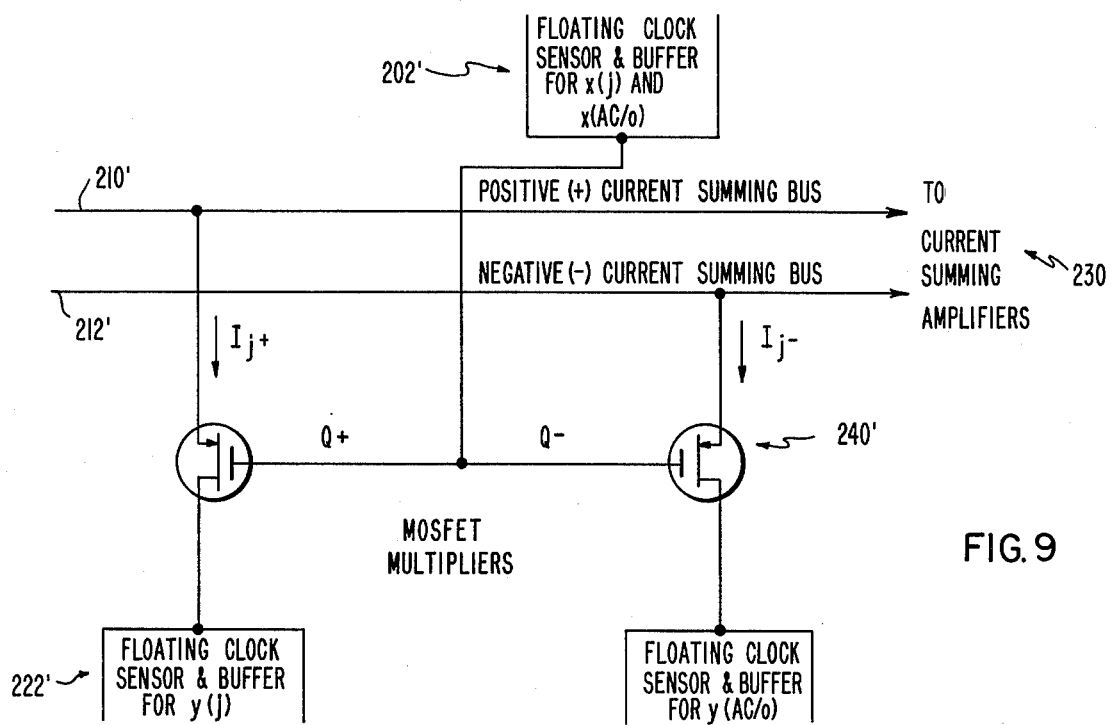
FIG. 9 is a diagrammatic representation of a more simplified approach relative to the arrangement of FIG. 8, such approach being based on the use of MOSFET multipliers.

Formula (16) shows that, when the cell 240' of FIG. 9 is used in the intended differential configuration, the desired product is obtained with biases and nonlinearities subtractively cancelled to eliminate offset errors with a limit determined by cell-to-dell geometric fluctuations. This dual-differential operation has another important benefit: The accumulation of thermal leakage or dark-current charge in the CCD potential wells is indistinguishable from the desired signal charge. In the signal channel CCD, both the AC/o sample and the signal sample pass through the same elements taking identical on-chip paths. Hence each will contain identical dark-current accumulation which cancels in the differential operation. For the reference channel CCD, although the AC/o and reference samples still follow identical paths, they rest in adjacent cells (as shown in FIGS. 1 and 8) during the time needed for a single correlation sequence. Thus dark-current charge accumulation will cancel to the extent that dark-current in adjacent cells over the correlation period do not differ.

Figure 10:
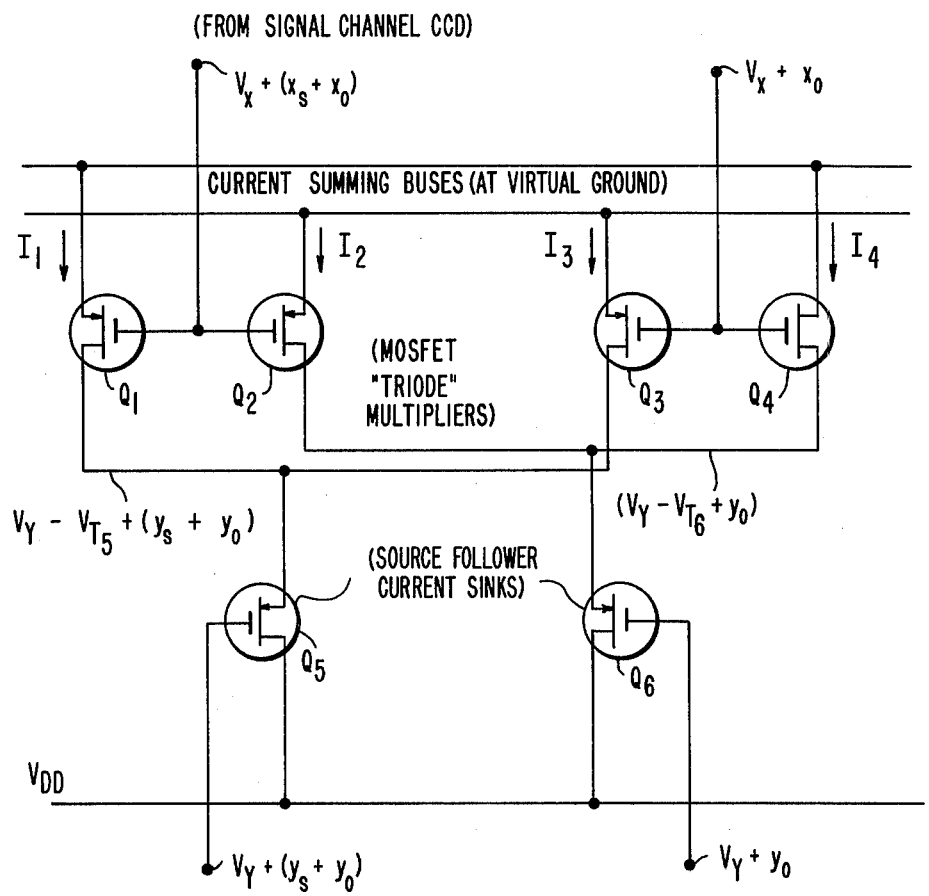
FIG 10 is a diagrammatic representation used for explaining the double differential operation of a multiplier cell.

The above can be expanded for the cells as shown in FIG. 10. With reference to FIG. 10, if we designate the charge packets when the signal and its AC zero are sampled by ($x_s + x_o$), respectively, and ($y_s + y_o$), ($y_o$) designate the reference and its AC zero, respectively; then the various currents to be summed must be (See FIG. 10 for labeling of current and voltage nodes):

$$I_1 = \alpha_1 \cdot (V_x + x_s + x_o - V_{T_1}) \cdot (V_Y + y_s + y_o - V_{T_5}) + z_1$$

$$I_2 = \alpha_2 \cdot (V_x + x_s + x_o - V_{T_2}) \cdot (V_y + y_o - V_{T_6}) + z_2$$

$$I_3 = \alpha_3 \cdot (V_x + x_o - V_{T_3}) \cdot (V_Y + y_s + y_o - V_{T_5}) + z_3$$

$$I_4 = \alpha_4 \cdot (V_x + x_o - V_{T_3}) \cdot (V_Y + y_o - V_{T_6}) + z_4$$

Now let $\alpha_K = \alpha + \delta\alpha_K$, $V_{TK} = V_T + \delta V_{TK}$, and $z_K = z + \delta z_K$, so that $$I_1 - I_3 = \alpha \cdot (x_s - \delta V_T) \cdot (V_Y + y_s + y_o - V_{T_5}) + (\delta_z) + (\delta\alpha)(\ldots)$$

$$I_2 - I_4 = \alpha \cdot (x_s - \delta V_T) \cdot (V_Y + y_o - V_{T_6}) + (\delta_z) + (\delta\alpha)(\ldots)$$

Finally, we find that $\Sigma_j = (\Sigma +)_j - (\Sigma -)_j = I_1 + I_4 - I_2 - I_3$ or $$\Sigma_j = \alpha \cdot (x_s - \delta V_T) \cdot (y_s - \delta V_T) + (\delta_z) + (\delta\alpha)(\ldots)$$

In the ideal limit of ($\delta V_T$, $\delta\alpha$, $\delta_z$) → 0 we have
$\Sigma_j = \alpha \cdot x_s y_s$ when the transistor geometries and threshold voltages are truly matched within the $j^{th}$ multiplier cell. Consequently, the double differential operation of the multiplier cell, as indicated in FIG. 10, automatically cancels undesirable biases and nonlinearities because the six transistors are fabricated in a compact cell area, facilitating the needed matching of geometries and threshold voltages.

An On-Chip Summing Point Amplifier

The function of this part of the analog correlator device is to sum all the individual product currents coming from the cells shown in FIG. 8 so as to prevent interaction between the various currents, thereby yielding the final result:

$$F(j) = \sum_{j=0}^{M} \alpha \cdot x_s(J+j) \cdot y_s(J) \quad (17)$$

where the time period needed to generate a complete correlation function (e.g., autocorrelations required for power spectra) is approximately the time to shift the signal point "j" through the "M+1" tapping and weighting cells. The time for a SINGLE correlation point with a sum of M+1 weighted samples is merely the time to advance the signal samples through two positions requiring the microsecond or less.

Equation (17) assumes that the two (source) summing busses are each connected to low impedance AC-signal virtual ground points. That is, the low impedance character of the summing point amplifier is essential to prevent interaction between the separate multiplying cells. To accomplish this, we have selected a lateral, bipolar, NPN transistor (see H.C. Lin, J.C. Ho, R.R. Iyer, K. Kwong, "CMOS-Biplar Transistor Structure", IEEE Transaction on Electron Devices, ED-16, pp. 945-51, Nov. 1969) operating in the common-base mode as illustrated in FIG. 8; since it is compatible with the silicon-gate CMOS technology needed for the CCD, while still providing the required low input impedance, $R_i$:

$$R_i = r_c + r_b \left[ \frac{(1-\alpha)r_c + R_L}{r_b + r_c + R_L} \right]$$

where
 $r_c$ = collector resistance, typically 2 megohms
 $r_b$ = base resistance, typically 1 kilohm
 $r_e$ = emitter resistance, typically 20 ohms
 $R_L$ = load resistor in collector leg (off-chip)
Hence,
$r_e + (1-\alpha)r_b \leq R_i \leq r_b$ as $R_L$ goes from zero to infinity. The effective source resistance for each current summing bus is the parallel combination of the drain-source resistance of all the MOSFET multipliers connected to that bus. Furthermore, the on-chip, common-base, lateral, bipolar, "current summing amplifier transistors" greatly reduce capacitive loading on the MOSFET multipliers because of their on-chip proximity and since they offer no Miller capacitance at their input.

Correlator Circuit Schematic

Figure 11:
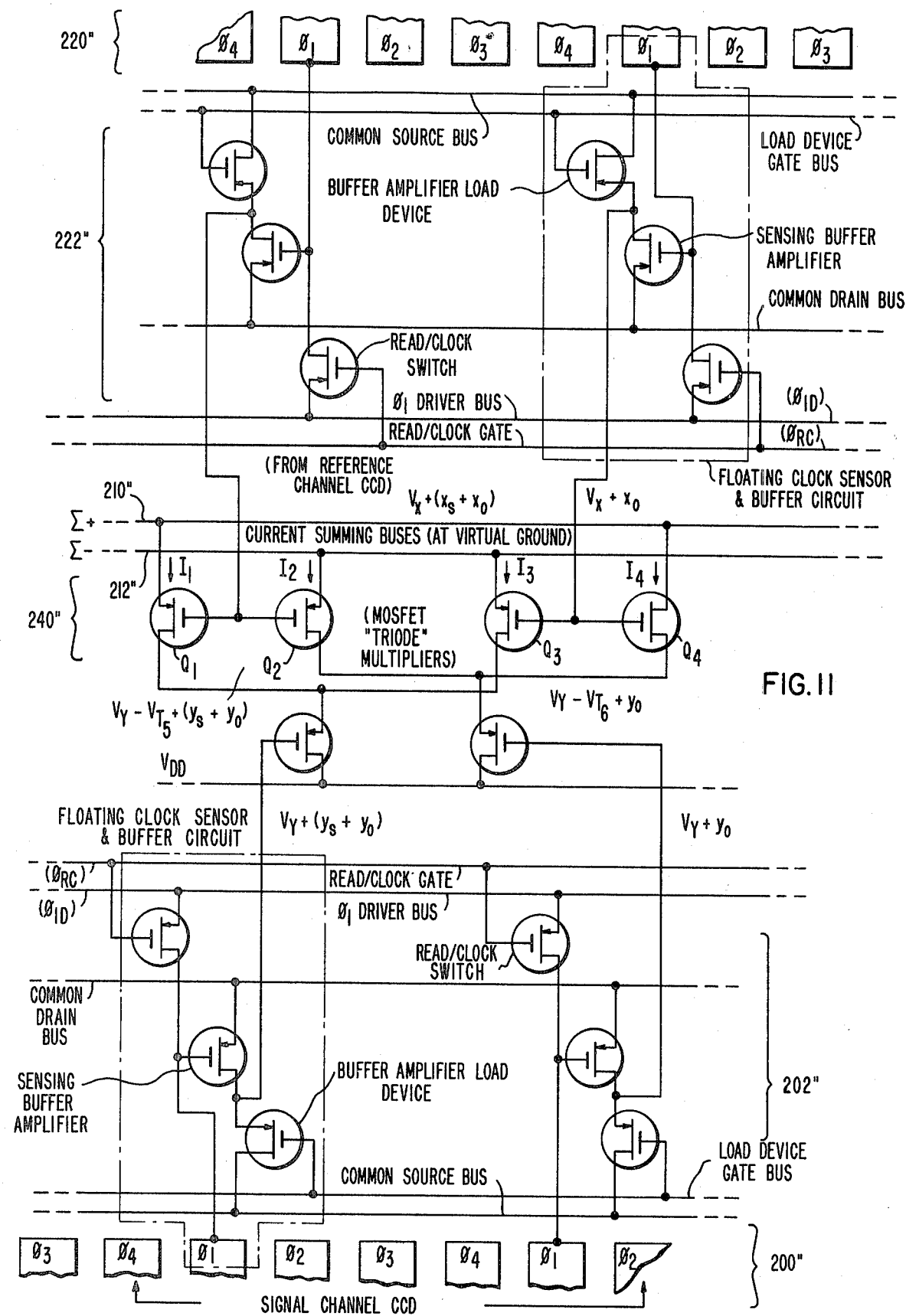
FIG. 11 illustrates a circuit schematic corresponding to the general block diagram of the correlator of the invention, as shown in FIG. 8.

FIG. 11 illustrates a circuit schematic corresponding to the general block diagram of the correlator of the invention as shown in FIG. 8. To indicate the interchangeability of the CCD signal and reference channels, the reference channel 220" is indicated at the top and the signal channel 200" at the bottom, the reverse of the relationship in FIG. 8. The channels, nevertheless, correspond to those of FIG. 8. The floating clock sensor and buffer circuits generally designated 202 and 223 in FIG. 8 appear in their specific circuit schematics at 202" and 222" in FIG. 11. Multiplier cells as shown and discussed in relation to FIG. 8 appear at 240". Positive and negative current summing buses are shown at 210" and 212" as in the preceding figures. The broken-away elements labeled $\phi_1, \phi_2, \ldots$ correspond to clock electrodes of the corresponding CCD shift registers, the floating clock sensor and buffer circuits being shown as associated with the electrode $\phi_1$ as the floating clock electrode.

With regard to the floating clock sensor and buffer circuits 222", a single one of these identical circuits is identified at 222-K by a dotted line enclosure. The circuit thereof will be seen to correspond to that of FIG. 6 and hence not require specific discussion. The pertinent components are specifically labeled in the figure for ease of identification as to their functions.

In FIG. 11, as contrasted to the circuit of FIG. 6, the output from the buffer amplifier is supplied to the multipliers including the pair of transistors Q3 and Q4 comprising MOSFET "triode" multipliers. As will be appreciated, the multiplication function, or product generation, is derived from a current of an FET operated in the triode region and hence is related to the product of the gate-to-source voltage times the drain-to-source voltage. Accordingly, the transistors Q5 and Q6 are provided, functioning as source follower current sinks for the drain-to-source current flow of the transistors Q2 and Q4. It now should be apparent as well that the reference and signal CCD channels are interchangeable.

In conclusion, the subject invention achieves a highly significant objective of providing a complex system function through use of CCD technology. Of particular significance is the ability to combine the circuit elements performing the requisite functions on a single chip and, in essence to perform "on-chip" correlation of two analog signals in real time. The above-noted dual-differential operation is significant for its cancellation of biases and non-linearities and the compensation provided for dark-current accumulation, subject to the limitation as above noted. The general techniques and implementations disclosed herein hence achieve many of the objectives set forth above, providing practical implementations of CCD technology.

The applications of the disclosed correlator are, of course, numerous. Any suitable form of signal and reference information may be provided. Mentioned above is the use of the correlator for spectral analysis. Additional modifications and uses are, of course, immediately apparent. The reference channel may contain weights such as for a filtering or adaptive equalization function and, via differential speeds of propagation of the weight samples through the reference channel relatively to signal samples through the signal channel, filtering and equalization functions can readily be performed.

These and other modifications and adaptations of the invention will readily be apparent to those of skill in the art. Hence, it is intended by the appended claims to cover all such modifications and adaptations which fall within the true spirit and scope of the invention.

What is claimed is:
1. An analog correlator comprising:
 first and second charge transfer shift register devices each comprising a plurality of successive stages and operable to propagate a charge packet therethrough at a predetermined shift cycle rate,
 injector means for injecting a charge packet into each said shift register for propagation therethrough, means for supplying samples of a signal and of a function to respective said injectors associated with said first and second shift registers for injecting charge packets corresponding thereto for propagation through said respective shift registers, means for effecting parallel, non-destructive sensing of said charge packets propagating through corresponding stages of said first and second shift registers and for providing corresponding first and second output potential signals representative thereof, means for multiplying each of the corresponding first and second output potential signals from said sensing means to produce respectively corresponding output product signals indicative of the respective products thereof, and means for summing the output product signals of said multiplier means for all of said corresponding, respective sensing means of said first and second shift registers.

2. A correlator as recited in claim 1 wherein each said means for supplying said signal and function samples includes a source of a reference voltage, means for selecting alternate samples of said reference voltage and said signal, and of said reference voltage and said function for supplying to the respective said shift registers to effect injection and propagation of respectively corresponding signal and reference, and function and reference, charge packets through said respective first and second shift registers, and said multiplying means differentially multiplies the output signals sensed from said respective first and second shift registers in accordance with said propagating charge packets corresponding to said signal and reference, and to said function and reference values, each said multiplier having a differential configuration to produce the multiplication product output thereof with biases and non-linearities of said respective output signals from said shift registers cancelled, at least as to said signal samples.

3. A correlator as recited in claim 1 for performing the function:

$$F(j) = \sum_{J=O}^{M} x(J+j) \cdot y(J)$$

where $x(j)$ represents the samples of the signal and $y(J)$ represents the samples of the function.

4. A correlator as recited in claim 1 wherein said shift registers, said multipliers, and said summing means are provided on a monolithic semiconductor structure.

5. A correlator as recited in claim 1 wherein each of said shift registers including a plurality of said sensor means respectively associated with plural stages of said shift register, each of said stages including a group of plural electrodes, one thereof comprising a sensor electrode, and there is further provided:

control means for supplying clocking signals to respective ones of said plural electrodes of each of said stages to shift a charge packet through the successive stages of said charge transfer device at a predetermined cyclic shift rate, and defining in said shift cycle thereof a succession of reset, clamp, mux, and sample intervals in relation to the said clocking signals, said control means generating a reset signal in timed relation to said clocking signals for defining said reset interval, switching means connected to the said predetermined sensor electrode and to said control means for receiving the clocking signal associated with said sensor electrode, said switching means normally being open so as to isolate said sensor electrode from said clocking signal and said control means, said switching means being rendered conductive in response to said reset signal, for applying said corresponding clocking signal to said sensor electrode to render the latter repulsive and then attractive during said reset interval, said control means applying corresponding clocking signals to others of said group of electrodes of said output stage during said reset interval to isolate said sensor electrode from charge packets propagating through said charge transfer device prior to said sensor electrode clocking signal rendering said sensor electrode attractive during said reset interval, said control means terminating said reset signal and opening said switching means thereby to isolate said sensor electrode from said clocking signal and said control means, said sensor electrode maintaining said attractive potential condition thereof, during said clamp, mux, and sample intervals, said corresponding clocking signals applied to others of said electrodes of said group advancing a charge packet to the potential well of said sensor electrode during said mux interval and confining said charge packet therein during said sample interval, means connected to said sensor electrode for sampling the potential induced therein by the charge packet retained in the potential well thereof during said sample interval and producing an output signal sample representative thereof, and said sample interval terminating prior to a next successive reset interval.

6. A correlator as recited in claim 1 wherein said sensing means comprise floating clock electrode sensors.

7. A correlator as recited in claim 1 wherein said injectors for said respective charge transfer device shift registers comprise stabilized charge injectors, each injecting a charge packet linearly related to the respective input signal and function samples.

8. A correlator as recited in claim 1, further comprising:

means for performing extended double correlation for cancellation of threshold and leakage current non-uniformities of both said signal and function charge transfer device channels.

* * * * *